United States Patent
Kobayashi

(10) Patent No.: US 8,852,857 B2
(45) Date of Patent: *Oct. 7, 2014

(54) SUBSTRATE TREATMENT METHOD

(75) Inventor: Shinji Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 202 days.

This patent is subject to a terminal disclaimer.

(21) Appl. No.: 13/399,041

(22) Filed: Feb. 17, 2012

(65) Prior Publication Data

US 2012/0225389 A1 Sep. 6, 2012

(30) Foreign Application Priority Data

Mar. 3, 2011 (JP) ................................ 2011-046691

(51) Int. Cl.
  *G03F 7/40* (2006.01)
  *H01L 21/67* (2006.01)
  *H01L 21/677* (2006.01)

(52) U.S. Cl.
  CPC .... *H01L 21/67748* (2013.01); *H01L 21/67103* (2013.01)
  USPC ............................ 430/432; 430/330; 430/329

(58) Field of Classification Search
  CPC ............. G03F 7/405; G03F 7/42; G03F 7/40; G03F 7/168; G03F 7/70625; G03F 7/70716
  USPC ......................................... 430/432, 330, 329
  See application file for complete search history.

(56) References Cited

U.S. PATENT DOCUMENTS

| 2005/0087129 A1* | 4/2005 | Kitano et al. .................. 118/666 |
| 2010/0020297 A1* | 1/2010 | Inatomi .......................... 355/30 |
| 2012/0225390 A1* | 9/2012 | Kobayashi et al. ........... 430/432 |

FOREIGN PATENT DOCUMENTS

| JP | 2005-019969 A | 1/2005 |
| JP | 2005-242109 A | 9/2005 |
| JP | 2008-171908 A | 7/2008 |
| JP | B2-4328667 | 6/2009 |
| JP | B2-4343018 | 7/2009 |

* cited by examiner

*Primary Examiner* — Daborah Chacko Davis
(74) *Attorney, Agent, or Firm* — Posz Law Group, PLC

(57) ABSTRACT

A substrate treatment method of performing treatment on a substrate on which a pattern mask has been formed by exposure and developing treatment to improve roughness of the pattern mask includes the processes of: mounting and heating the substrate on a stage in a treatment container; then supplying a solvent gas to a center portion of a front surface of the substrate while exhausting the solvent gas from a periphery of the substrate to swell the pattern mask; and while performing the process of supplying and exhausting a solvent gas, forming a temperature gradient in the substrate via the stage such that a temperature at the center portion of the substrate is higher than a temperature at a peripheral portion of the substrate.

8 Claims, 18 Drawing Sheets

SUBSTRATE TREATMENT METHOD

BACKGROUND OF THE INVENTION

1. Field of the Invention

The present invention relates to a substrate treatment method for improving roughness of a pattern mask.

2. Description of the Related Art

Due to the wave properties of light applied to a resist film on a wafer during exposure processing, variation in measured dimension called LWR (Line Width Roughness) occurs in a resist pattern formed after development. If a base film is etched using the resist film having the rough pattern as described above as a mask, the etching shape is affected by the roughness, with the result that a circuit pattern formed by the etching becomes rough in shape and possibly fails to manufacture a semiconductor device with a desired quality.

Hence, it is discussed to expose the resist pattern in a solvent atmosphere to swell and dissolve its surface to thereby smooth the surface of the resist pattern. For example, Japanese Patent Publication No. 4343018 describes, as an apparatus performing such treatment, a substrate treatment apparatus which includes a chuck sucking the wafer, a nozzle supplying a vaporized solvent from above the wafer, a moving mechanism moving the nozzle along a radial direction of the wafer, and a cup body surrounding the side circumference of the wafer and exhausting the inside thereof. However, provision of the cup body and the moving mechanism for the nozzle in the substrate treatment apparatus leads to an increase in footprint of the substrate treatment apparatus and an increase in manufacturing cost of the substrate treatment apparatus.

Hence, it is discussed to improve the roughness of the resist pattern using a substrate treatment apparatus including a treatment container storing a wafer, a discharge port provided at the treatment container, and a supply mechanism supplying a vaporized solvent from the discharge port. However, a problem of the substrate treatment apparatus is that it is difficult to perform treatment with high uniformity within the wafer.

Concretely describing the problem, the vaporized solvent flows on the wafer surface while adhering to the wafer, so that the supply amount of the solvent is larger near the discharge port than at a position away from the discharge port. Further, variation in flow speed of the vaporized solvent occurs within the wafer due to the arrangement of the discharge port and an exhaust port provided at the treatment container to cause a difference in concentration distribution and a place where the proportion of molecules of the solvent colliding with the wafer is higher. This possibly makes the resist pattern excessively swell to fall down or dissolve. In particular, when the line width of the resist pattern is made smaller in order to form a fine circuit pattern in the base film, the ratio of a thickness area where the solvent permeates to the thickness of the pattern becomes larger, and therefore the falling and dissolution of the pattern are thought to become likely to occur. On the other hand, at the position of the wafer away from the discharge port and at a position where the proportion of collision is small due to the variation in flow speed, the solvent cannot sufficiently eliminate in some cases the roughness of the resist pattern because the supply amount is small.

Japanese Patent Publication No. 4343018 does not describe the method to solve the above-described problem. Further, Japanese Patent Publication No. 4328667 describes a substrate treatment apparatus which supplies a vaporized solvent from a nozzle but does not describe the method to solve the problem.

SUMMARY OF THE INVENTION

The present invention is made under such circumstances and its object is to provide a technique capable of preventing dissolution of a pattern mask formed on a substrate and uniformly smoothing the surface of the pattern mask within the substrate.

A substrate treatment method of the present invention is a substrate treatment method of performing treatment on a substrate on which a pattern mask has been formed by exposure and developing treatment to improve roughness of the pattern mask, the method including the processes of:
  mounting and heating the substrate on a stage in a treatment container;
  then supplying a solvent gas to a center portion of a front surface of the substrate while exhausting the solvent gas from a periphery of the substrate to swell the pattern mask; and
  while performing the process of supplying and exhausting a solvent gas, forming a temperature gradient in the substrate via the stage such that a temperature at the center portion of the substrate is higher than a temperature at a peripheral portion of the substrate.

Another substrate treatment method of the present invention is a substrate treatment method of performing treatment on a substrate on which a pattern mask has been formed by exposure and developing treatment to improve roughness of the pattern mask, the method including the processes of:
  mounting and heating the substrate on a stage in a treatment container;
  then supplying a solvent gas to a peripheral portion of a front surface of the substrate while exhausting the solvent gas from above a center portion of the substrate to swell the pattern mask; and
  while performing the process of supplying and exhausting a solvent gas, forming a temperature gradient in the substrate via the stage such that a temperature at the center portion of the substrate is higher than a temperature at the peripheral portion of the substrate.

Still another substrate treatment method of the present invention is a substrate treatment method of performing treatment on a substrate on which a pattern mask has been formed by exposure and developing treatment to improve roughness of the pattern mask, the method including the processes of:
  mounting and heating the substrate on a stage in a treatment container;
  then supplying a solvent gas to one end side of a front surface of the substrate while exhausting the solvent gas from another end side of the substrate to swell the pattern mask; and
  while performing the process of supplying and exhausting a solvent gas, forming a temperature gradient in the substrate via the stage such that a temperature at the one end side of the substrate is higher than a temperature at the another end side of the substrate.

Further another substrate treatment method of the present invention is a substrate treatment method of performing treatment on a substrate on which a pattern mask has been formed by exposure and developing treatment to improve roughness of the pattern mask, the method including the processes of:
  mounting the substrate on a stage in a treatment container; and
  supplying a solvent gas heated to a temperature higher than a temperature of the substrate to a center portion of a front surface of the substrate while exhausting the solvent gas from a periphery of the substrate to swell the pattern mask.

Yet another substrate treatment method of the present invention is a substrate treatment method of performing treatment on a substrate on which a pattern mask has been formed by exposure and developing treatment to improve roughness of the pattern mask, the method including the processes of:
  mounting the substrate on a stage in a treatment container; and
  supplying a solvent gas heated to a temperature higher than a temperature of the substrate to one end side of a front surface of the substrate while exhausting the solvent gas from another end side of the substrate to swell the pattern mask.

According to the present invention, for supplying the solvent gas to the front surface of the substrate, a temperature gradient is formed in the substrate by heating the substrate such that the temperature at a place where the concentration of the solvent gas is high and the molecules of the solvent are more likely to collide with the mask pattern is higher than the temperature at a place where the concentration of the solvent gas is low and the molecules of the solvent are less likely to collide with the mask pattern. By forming the temperature gradient as above, a larger amount of solvent vaporizes at the place where the molecules of the solvent are more likely to collide with the mask pattern than at the place where the molecules of the solvent are less likely to collide with the mask pattern. Accordingly, it is possible to prevent dissolution of the mask pattern and smooth its front surface with high uniformity, thus suppressing the decrease in yield. Further, the solvent gas heated to a temperature higher than the temperature of the substrate is supplied starting from the center portion of the substrate to a periphery of the substrate or from one end side to the other end side of the substrate. Since the temperature of the solvent gas is higher at the supply side of the solvent gas than at the exhaust side, the adsorption of the solvent to the pattern mask is suppressed, with the result that the dissolution of the pattern mask can be similarly prevented and its surface can be smoothed with high uniformity.

DETAILED DESCRIPTION OF THE INVENTION

First Embodiment

Figure 1:
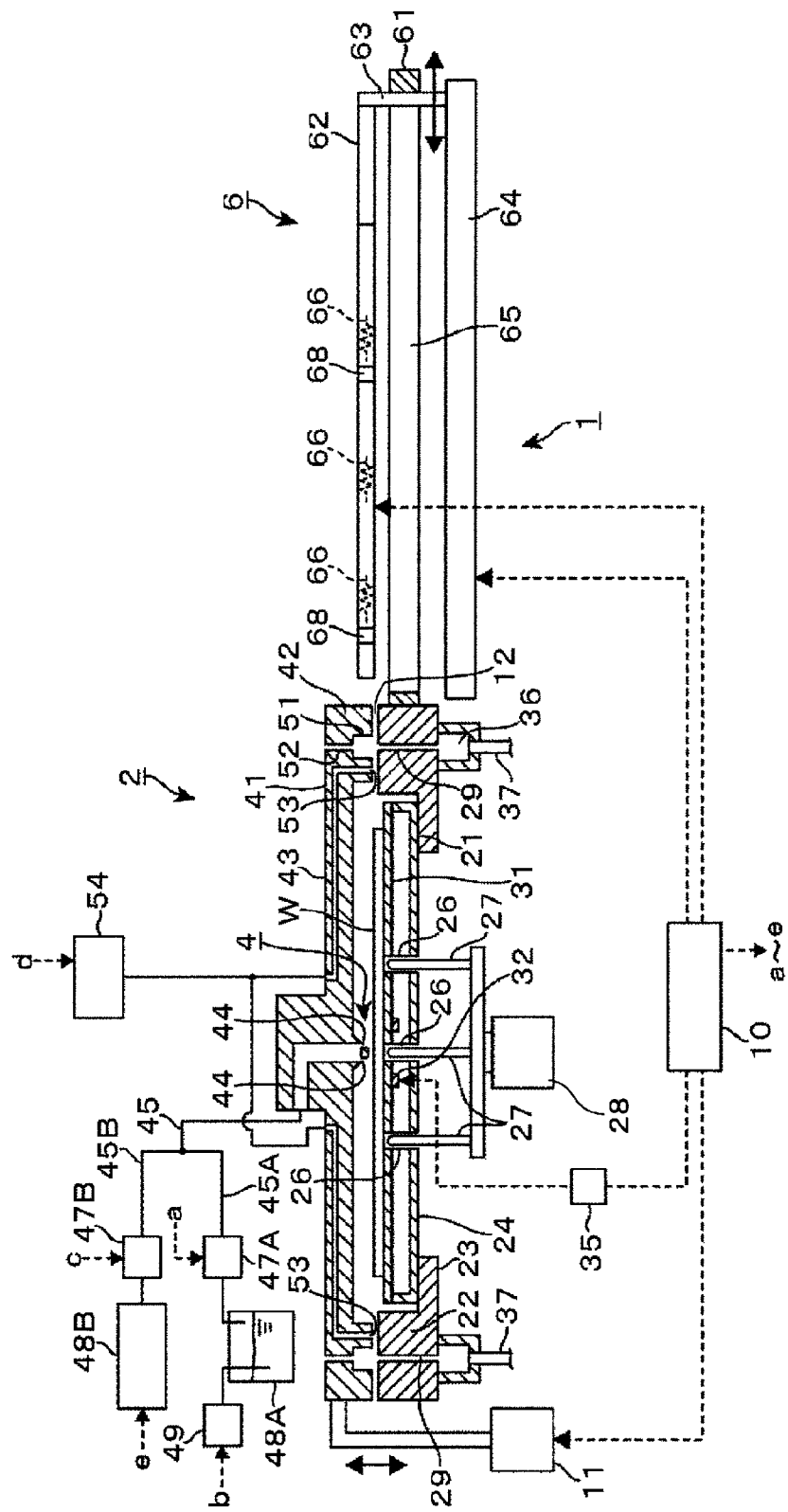
FIG. 1 is a longitudinal side view of a solvent supply apparatus according to this embodiment.

A solvent supply apparatus 1 according to an embodiment of the present invention will be described referring to FIG. 1 and FIG. 2 being a longitudinal side view and a transverse plan view thereof. The solvent supply apparatus 1 includes a treatment container 2 for treating a wafer W and a transfer mechanism 6 transferring the wafer W being a substrate between the treatment container 2 and the outside of the solvent supply apparatus 1. On the front surface of the wafer W transferred into the treatment container 2, a resist film has been formed. The resist film has undergone exposure and developing treatment and a resist pattern being a pattern mask has been formed in the resist film.

Figure 3:
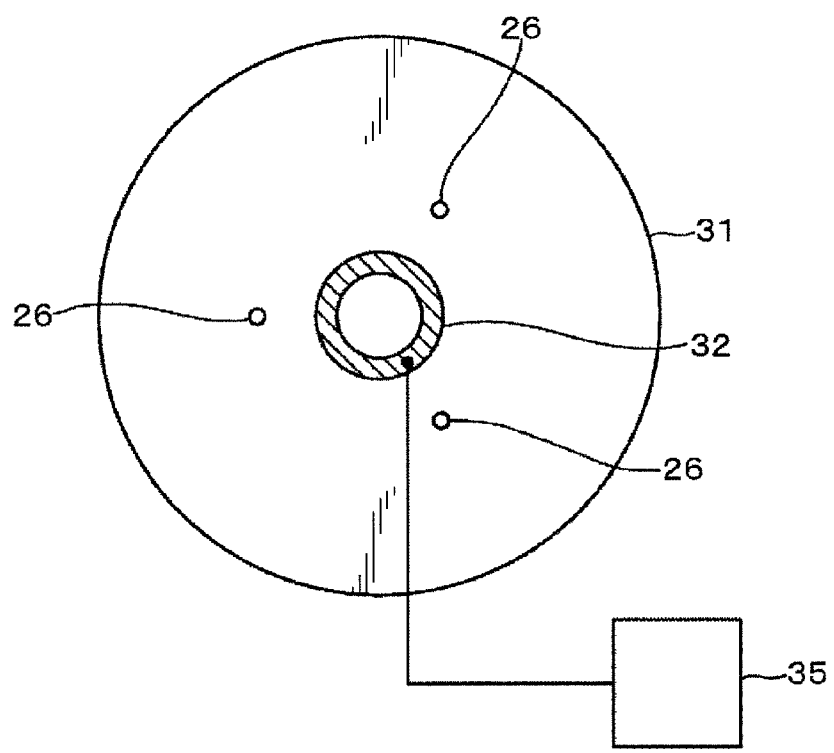
FIG. 3 is a plan view illustrating a rear surface of a hot plate provided in the solvent supply apparatus.

The treatment container 2 is formed in a flat circular shape and includes a container body 21 and a lid body 41. The container body 21 includes a side wall part 22 forming its peripheral edge portion and a bottom wall part 23 projecting inward from the lower end of the side wall part 22, and a stage 24 is provided on the bottom wall part 23. The surface of the stage 24 is composed of a hot plate 31 for horizontally mounting the wafer W thereon. At the center portion on the rear surface side of the hot plate 31, a ring-shaped heater 32 forming a temperature adjustment mechanism for the state 24 is provided as illustrate in FIG. 3. The heater 32 is composed of a heating wire but is illustrated as a plate-shaped member for convenience in the drawing. The heater 32 is connected to a power controller 35 which independently controls the power to be supplied to the heater 32.

Returning to FIGS. 1, 2 and continuing the description, in three holes 26 provided in the stage 24, pins 27 are inserted. The pins 27 project and retract from the top of the stage 24 by means of a raising and lowering mechanism 28 to deliver the wafer W to/from the transfer mechanism 6.

In the front surface of the side wall part 22, many purge gas discharge ports 29 open along the circumferential direction thereof. A ring-shaped space 36 communicating with the purge gas discharge ports 29 is formed under the side wall part 22, and ends of a plurality of purge gas supply pipes 37 are connected to the lower part of the space 36 at intervals in the circumferential direction. The other ends of the purge gas supply pipes 37 are connected to a not-shown supply mechanism which sends an N2 gas as a purge gas under pressure, and the purge gas supplied from the supply mechanism to the space 36 spreads in the space 36 and is discharged from the purge gas discharge ports 29.

The lid body 41 is configured to freely rise and lower by means of a raising and lowering mechanism 11. The lid body 41 includes a side wall part 42 forming its peripheral edge portion and an upper wall part 43 surrounded by the side wall part 42, and the lower end of the side wall part 42 is located at a position lower than the lower end of the upper wall part 43. When treating the wafer W, the lid body 41 is moved to a treatment position illustrated in FIG. 1, whereby the lower end of the upper wall part 43 and the upper end of the side wall part 22 of the container body 21 approach to each other via a gap 12.

Figure 4:
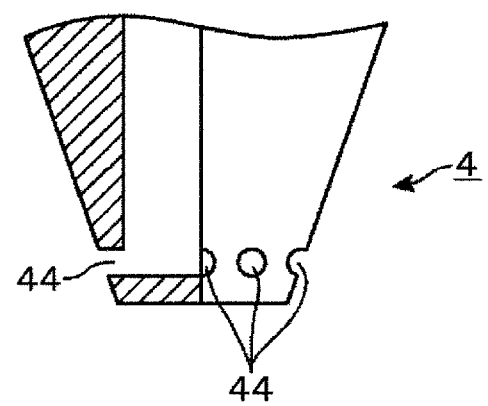
FIG. 4 is a longitudinal side view of a gas supply part of the solvent supply apparatus.

A center portion on the rear surface side of the upper wall part 43 projects downward to form a gas supply part 4. As illustrated in FIG. 4, many gas discharge ports 44 open along the circumferential direction at the side circumference of the gas supply part 4 and can discharge gas starting from the center portion toward the peripheral portion of the wafer W mounted on the stage 24 to thereby supply the gas over the entire wafer W. In FIG. 2, the flows of the gas discharged from the gas discharge ports 44 are indicated by broken-line arrows.

To the top of the lid body 41, the downstream end of a gas supply pipe 45 is connected, and the upstream side of the gas supply pipe 45 branches off to constitute gas supply pipes 45A, 45B. The upstream side of the gas supply pipe 45A is connected to a solvent supply source 48A via a flow rate control mechanism 47A. The solvent supply source 48A forms a tank in which a solvent capable of swelling resist is stored, and is connected to an N2 gas supply part 49 which supplies an N2 gas to a liquid phase of the stored solvent.

When the N2 gas is supplied from the N2 gas supply part 49 into the solvent supply source 48A, the inside of the solvent supply source 48A is pressurized and the solvent vaporizes, and a treatment gas made of the vaporized solvent and the N2 gas is supplied from the gas discharge ports 44 to the wafer W after its flow rate is controlled by the flow rate control mechanism 47A. Further, the upstream side of the gas supply pipe 45B is connected to an N2 gas supply source 48B which sends an N2 gas being a drying gas under pressure to the downstream side via a gas flow rate control mechanism 47B. The drying gas sent under pressure is supplied from the gas discharge ports 44 to the wafer W after its flow rate is controlled by the gas flow rate control mechanism 47B.

In the lower end of the side wall part 42 of the lid body 41, a ring-shaped recessed part 51 is formed at a position overlapping with the purge gas discharge ports 29. The recessed part 51 opens to the top of the lid body 41 via a plurality of exhaust paths 52, and the plurality of exhaust paths 52 are provided in the circumferential direction of the recessed part 51. Further, at the lower end of the side wall part 42, many exhaust ports 53 are arranged in the circumferential direction of the wafer W on the inner side of the recessed part 51. The exhaust ports 53 are connected to an exhaust mechanism 54.

Figure 5:
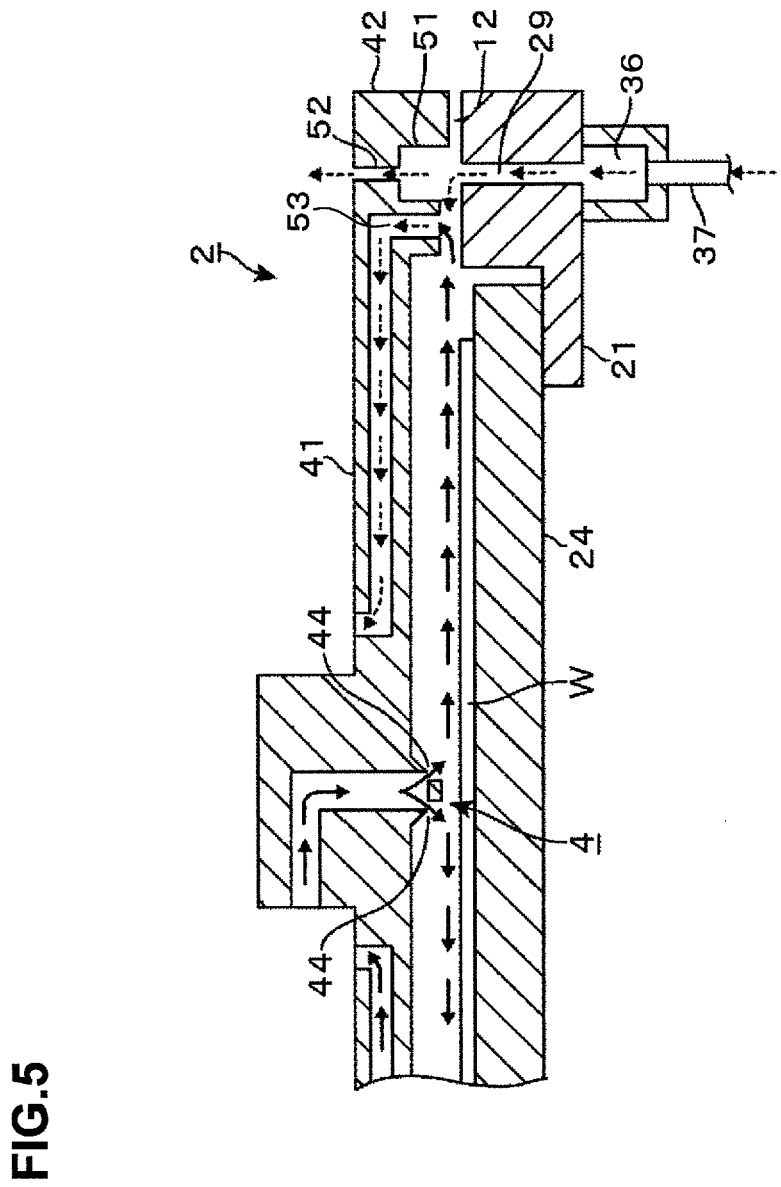
FIG. 5 is an explanatory view illustrating the flows of gases in a treatment container of the solvent supply apparatus.

In FIG. 5, the flow of the treatment gas and the flow of the purge gas inside the treatment container 2 during the treatment of the wafer W are indicated by solid arrows and dotted arrows, respectively. A part of the purge gas discharged from the purge gas discharge ports 29 flows into the recessed part 51 and flows therethrough to the outside of the treatment container 2, and another part of the purge gas flows, by suction through the exhaust ports 53, toward the inside of the treatment container 2 and into the exhaust ports 53 and is exhausted. In the state the flow of the purge gas is formed as described above, the treatment gas is discharged from the gas discharge ports 44, spreads in the lateral direction from the center portion to the peripheral portion of the wafer W, and flows toward the exhaust ports 53. Since the flow of the purge gas from the outside to the inside is formed as described above outside the exhaust ports 53, the treatment gas is blocked by the flow and never flows to the outside of the exhaust ports 53, and is removed through the exhaust ports 53. Though the flow of the treatment gas has been described, the purge gas is similarly supplied to the treatment container 2 also when the drying gas is supplied to the wafer W, and the drying gas flows through the treatment container 2 and is exhausted as with the treatment gas.

Returning to FIG. 1 and FIG. 2, the description is continued. Outside the treatment container 2, a base 61 is provided, and the aforementioned transfer mechanism 6 is provided at the base 61. The transfer mechanism 6 is composed of a horizontal moving plate 62, a support part 63 supporting the moving plate 62 on the base 61, and a moving mechanism 64. The support part 63 extends from the moving plate 62 to below the base 61 and is connected to the moving mechanism 64. Assuming that the position of the moving plate 62 illustrated in FIG. 1 and FIG. 2 is a waiting position, the moving plate 62 can horizontally move between the waiting position and a position above the stage 24 in the treatment container 2 by means of the moving mechanism 64. A numeral 65 in the drawing denotes a slit provided in the base 61 not to interfere with the movement.

The moving plate 62 will be described. Inside the moving plate 62, heaters 66 are provided, and the moving plate 62 heats the wafer W mounted on its front surface to a preset temperature. Numerals 67 in the drawing denote slits through which the pins 27 pass in order to deliver the wafer W to/from the stage 24. Numerals 68 in the drawing denote cutouts which are provided to deliver the wafer W to/from a transfer arm 13 which transfers the wafer W to the solvent supply apparatus 1.

Figure 2:
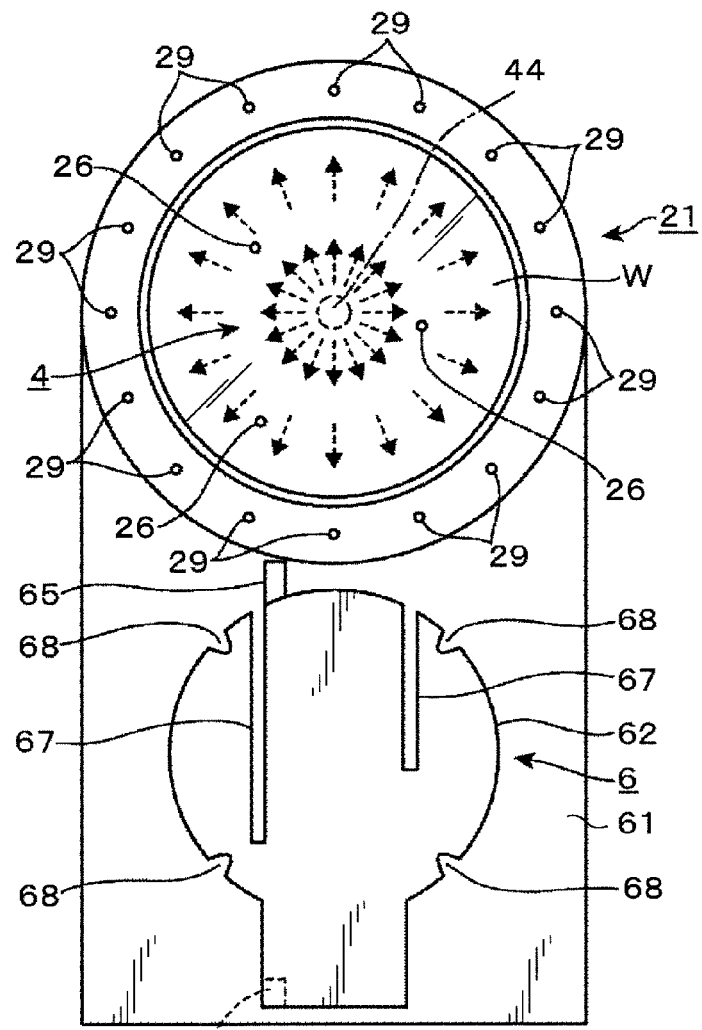
FIG. 2 is a plan view of the solvent supply apparatus.
Figure 2:
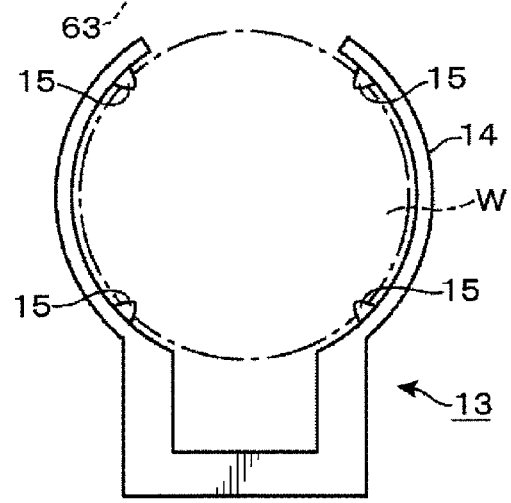

The transfer arm 13 illustrated in FIG. 2 includes a flat fork 14 surrounding the side circumference of the wafer W, and a support part 15 which extends inward from the fork 14 to support the rear surface of the wafer W. The transfer arm 13 is configured to freely move back and forth (up and down in FIG. 2) and rise and lower with respect to the moving plate 62, and delivers the wafer W to/from the moving plate 62 by combining the movements.

The solvent supply apparatus 1 includes a control unit 10 composed of a computer. The control unit 10 has commands (steps) installed to proceed the treatment in the solvent supply apparatus 1 as will be described later by sending control signals to the parts of the solvent supply apparatus 1 to control operations such as supply and stop of various gases and supply amounts of the gases, the temperatures of the wafer W on the moving plate 62 and on the stage 24, delivery of the wafer W between the treatment container 2 and the moving plate 62 and the stage 24, exhaust the inside of the treatment container 2, and the power supply to the heater 32 via the power controller 35. This program is stored in a computer storage medium, for example, a storage medium such as a flexible disk, compact disk, hard disk, or MO (magneto-optical disk), and installed into the control unit 10.

Figure 6:
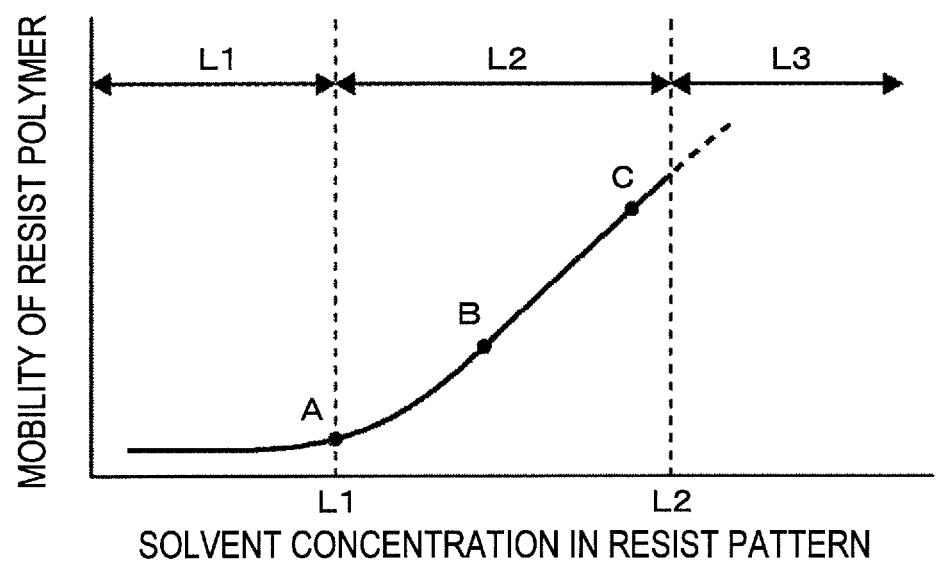
FIG. 6 is a graph chart representing the relation between the mobility of resist polymer and the solvent concentration in a resist pattern.

To describe the outline of the treatment in the above-descried solvent supply apparatus 1, the relation between the concentration of the solvent in the resist pattern on the front surface of the wafer W and the mobility of polymer constituting the resist when the already-described treatment gas is supplied to the wafer W by the solvent supply apparatus 1 will be described referring to the graph in FIG. 6. The vertical axis and the horizontal axis of the graph indicate the mobility of the resist polymer and the solvent concentration in the resist pattern, respectively.

At the time when the treatment gas is supplied to the resist pattern, molecules of the solvent move according to the temperature energy of the treatment gas. When the molecules in the solvent collide with the resist pattern, heat is conducted at the moment between the molecules and the resist pattern. Thus, the solvent gas is rapidly brought to the temperature of the wafer W, and the molecules adhere to the surface of the resist pattern. In other words, when the treatment gas is supplied to the resist pattern, the solvent permeates the surface of the resist pattern. However, if the supply amount of the treatment gas is small and the solvent concentration in the resist pattern is in a range equal to or less than a predetermined threshold value (a range L1 in the graph), the polymer hardly flows. For example, the resist pattern in the state at a point A in the graph has a solvent concentration at the threshold value in which the polymer hardly flows as described above. When the solvent concentration in the resist pattern becomes higher than the threshold value, the flowability of the polymer increases, and the surface of the resist pattern swells to improve the roughness. For example, a state that an optimal polymer flowability can be obtained is indicated at a point B in the graph.

When the supply of the treatment gas is continued and the solvent concentration becomes too high, the solvent permeates the inside of the resist pattern, resulting in an excessive swelling amount of the resist pattern. The excessively swelling resist pattern cannot hold its shape but curves, and dissolves as described in the section of Related Art. The shape of the pattern is held at a point C in the graph, but such dissolution occurs if the solvent concentration becomes further higher. In the graph, a solvent concentration range where the pattern is improved is indicated by L2, and a solvent concentration range where the dissolution of the pattern occurs is indicated by L3.

Accordingly, in order to improve the roughness of the resist pattern with high uniformity within the wafer W, it is required to perform treatment so that the solvent concentration in the resist pattern coincides with a predetermined concentration within the rage indicated by L2 in the graph. Here, when the solvent supply apparatus 1 continuously discharges the treatment gas from the gas discharge ports 44, the amount of the supplied treatment gas near the gas discharge ports 44, that is, at the center portion of the wafer W is larger than that at the peripheral portion of the wafer W, so that the concentration of the solvent at the center portion is higher than the concentration of the solvent at the peripheral portion.

Describing more concretely, the flow speed of the treatment gas and the concentration of the treatment gas are relatively high at the center portion of the wafer W close to the gas discharge ports 44, so that the proportion (probability) of the molecules in the solvent colliding with and adhering to the resist pattern is higher as described above, resulting in progress of swelling of the resist pattern at the center portion of the wafer W. However, since the treatment gas diffuses to the peripheral portion of the wafer W, the flow speed of the treatment gas decreases and the concentration of the treatment gas decreases at the peripheral portion. Accordingly, the proportion of the molecules in the solvent colliding with and adhering to the resist pattern is low, and the resist pattern less swells than at the central portion.

Figure 7:
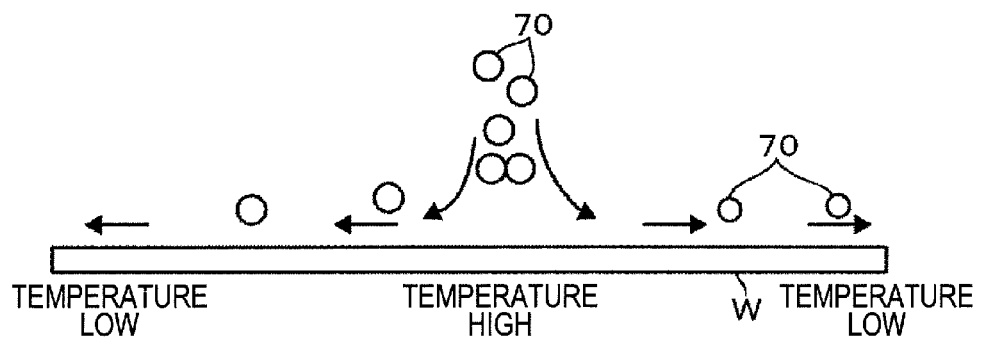
FIG. 7 is an explanatory view illustrating the movement of solvent molecules on the wafer surface.
Figure 8:
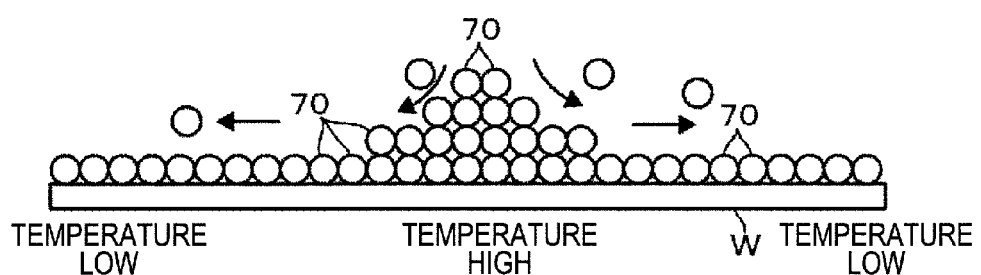
FIG. 8 is an explanatory view illustrating the movement of the solvent molecules on the wafer surface.

Hence, the temperature of the wafer W is controlled by the heater 32 to be higher at the center portion than at the peripheral portion at the supply of the treatment gas in the solvent supply apparatus 1. The appearance of the front surface of the wafer W when the temperature is controlled as described above will be described using schematic views in FIG. 7 to FIG. 9. As illustrated in FIG. 7, after the supply of the treatment gas is started, molecules 70 of the solvent are more likely to adhere to the center portion than to the peripheral portion as illustrated in FIG. 8 because the amount of the treatment gas supplied to the center portion of the wafer W is larger. However, since the temperature at the center portion of the wafer W is higher, the volatile amount from the center portion is larger.

Describing in more detail, the amount of the molecules 70 in the solvent collided with and adhered to the resist pattern as described above but separating from the resist pattern, that is, the amount vaporizing from the resist pattern as the solvent gas is affected by the balance between the solvent concentration in a gas layer directly above the wafer W and the solvent concentration in the resist pattern. This balance is the vapor-liquid equilibrium between the liquid solvent in the resist pattern and the gas solvent in the gas layer. An increase in the temperature of the wafer W decreases the solvent concentration in the atmosphere directly above the wafer W and proceeds vaporization of the solvent from the resist pattern due to the vapor-liquid equilibrium.

Figure 9:
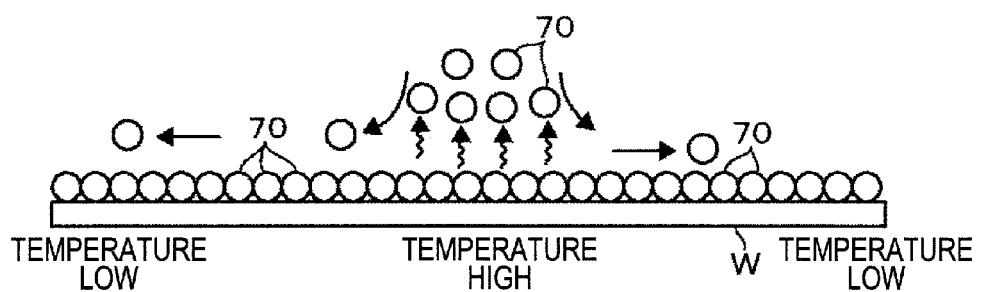
FIG. 9 is an explanatory view illustrating the movement of the solvent molecules on the wafer surface.

More specifically, many molecules 70 separate from the front surface of the wafer W as illustrated in FIG. 9 and are exhausted with the gas flow. Contrarily, the treatment gas is likely to condense at the peripheral portion of the wafer W because the temperature is lower at the peripheral portion of the wafer W than at the center portion. In short, the volatile amount of the adhered molecules 70 is smaller. Accordingly, the concentration of the solvent can be made uniform between the center portion and the peripheral portion of the wafer W. Further, the solvent further permeates the inside of the resist pattern as the supply time of the treatment gas becomes longer. For the purpose of preventing the permeation and the purpose of sufficiently ensuring the time when the solvent concentration on the surface of the resist pattern falls within the range L2 in the graph, the swelling of the resist pattern by the supply of the treatment gas and the drying treatment composed of the supply of the drying gas and the heating by the moving palate 62 are repeatedly performed. The drying gas supplied from the gas discharge ports 44 is higher in flow speed on the center portion side of the wafer W closer to the gas discharge ports 44 as with the solvent gas, so that the solvent concentration in the gas layer directly above the center portion of the wafer W is lower than the solvent concentration directly above the peripheral portion of the wafer W, thereby accelerating the vaporization of the solvent from the center portion of the wafer W due to the vapor-liquid equilibrium. The N2 gas is used as the drying gas in this embodiment, but the drying gas is not limited to that and, for example, dry air may be used.

Hereinafter, the operation of the solvent supply apparatus 1 will be concretely described referring to FIG. 10 to FIG. 16 illustrating the actions of the solvent supply apparatus 1 in respective processes and FIG. 17 being a schematic view of the resist pattern at the respective stages of the treatment. The description is made also referring to FIG. 18 as necessary. FIG. 18 is a time chart indicating a zone when the wafer W is treated in the solvent supply apparatus 1, a timing when the pins 27 in the stage 24 are raised and lowered, a zone when the treatment gas is supplied, a zone when the N2 gas is supplied, and the position and the moving direction of the moving plate 62 which are associated with one another. In this time chart, about the position and the moving direction of the moving plate 62, the time when the moving plate 62 is located above the stage 24 and the time when the moving plate 62 is moving toward the stage 24 are indicated by "IN", and the time when the moving plate 62 is located at the waiting position and the time when the moving plate 62 is moving from the position above the stage 24 to the waiting position are indicated by "OUT."

Figure 10:
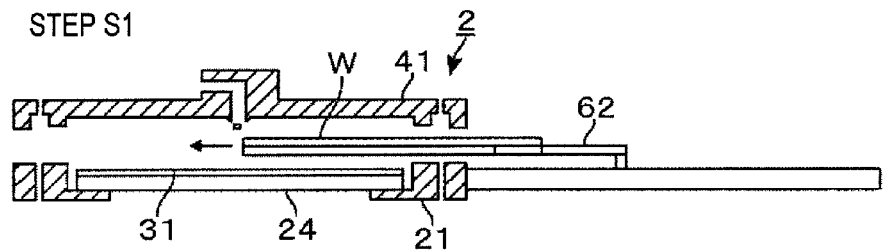
FIG. 10 is a process chart illustrating treatment by the solvent supply apparatus.
Figure 11:
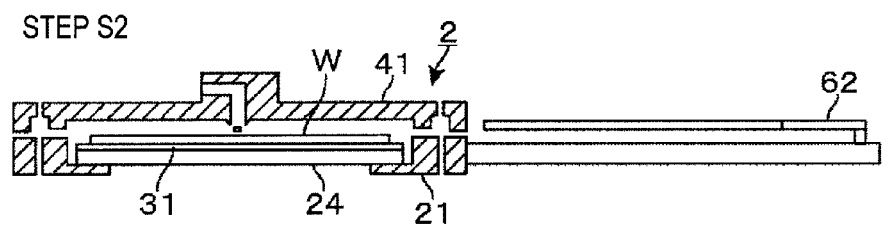
FIG. 11 is a process chart illustrating treatment by the solvent supply apparatus.

First, the wafer W is delivered by the transfer arm 13 to the moving plate 62 located at the waiting position (time t1 in FIG. 18). As indicated as state 1 in FIG. 17, a surface 72 of a resist pattern 71 of the wafer W is rough and formed with projections and depressions. The moving plate 62 moves to a position above the stage 24 as illustrated in FIG. 10 (time t2 in FIG. 18) (Step S1). The heater 32 increases the temperature of the hot plate 31 of the stage 24 so that the temperature at the center portion of the hot plate 31 becomes higher than the temperature at the peripheral portion. Then, when the pins 27 are raised to receive the wafer W (time t3 in FIG. 18), the moving plate 62 returns to the waiting position, and the pins 27 are lowered and the wafer W is mounted on the stage 24 as illustrated in FIG. 11 (time t4 in FIG. 18). The wafer W is adjusted in temperature by the hot plate 31 so that the temperature at the center portion of the wafer W becomes higher than the temperature at the peripheral portion (Step S2). The temperature at the center portion is, for example, 30° C. to 50° C., and the temperature at the peripheral portion is, for example, 23° C. to 45° C.

Figure 12:
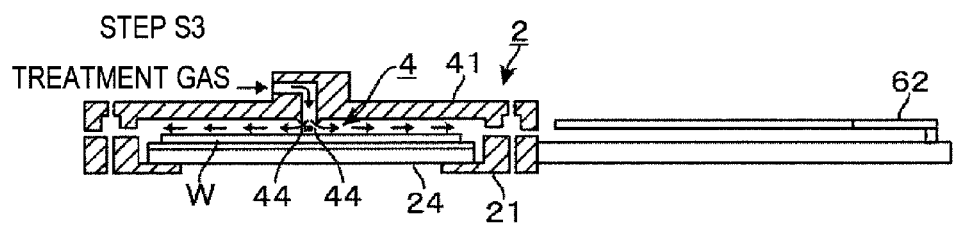
FIG. 12 is a process chart illustrating treatment by the solvent supply apparatus.

In parallel with the temperature adjustment of the wafer W, lowering of the lid body 41, discharge of the purge gas from the purge gas discharge ports 29, and exhaust of the purge gas from the exhaust ports 53 are performed. After a lapse of, for example, 10 seconds after the wafer W is mounted on the stage 24, the treatment gas is supplied from the gas discharge ports 44 of the gas supply part 4 to the center portion of the wafer W as illustrated in FIG. 12 (time t5 in FIG. 18) (Step S3), flows to the peripheral portion of the wafer W and is exhausted together with the purge gas as has been described. Note that though only the flow of the gas around the wafer W is illustrated for preventing the drawing from being complicated in the operation view such as FIG. 12, the gas flows are actually formed in the treatment container 2 as illustrated in FIG. 5.

Figure 17:
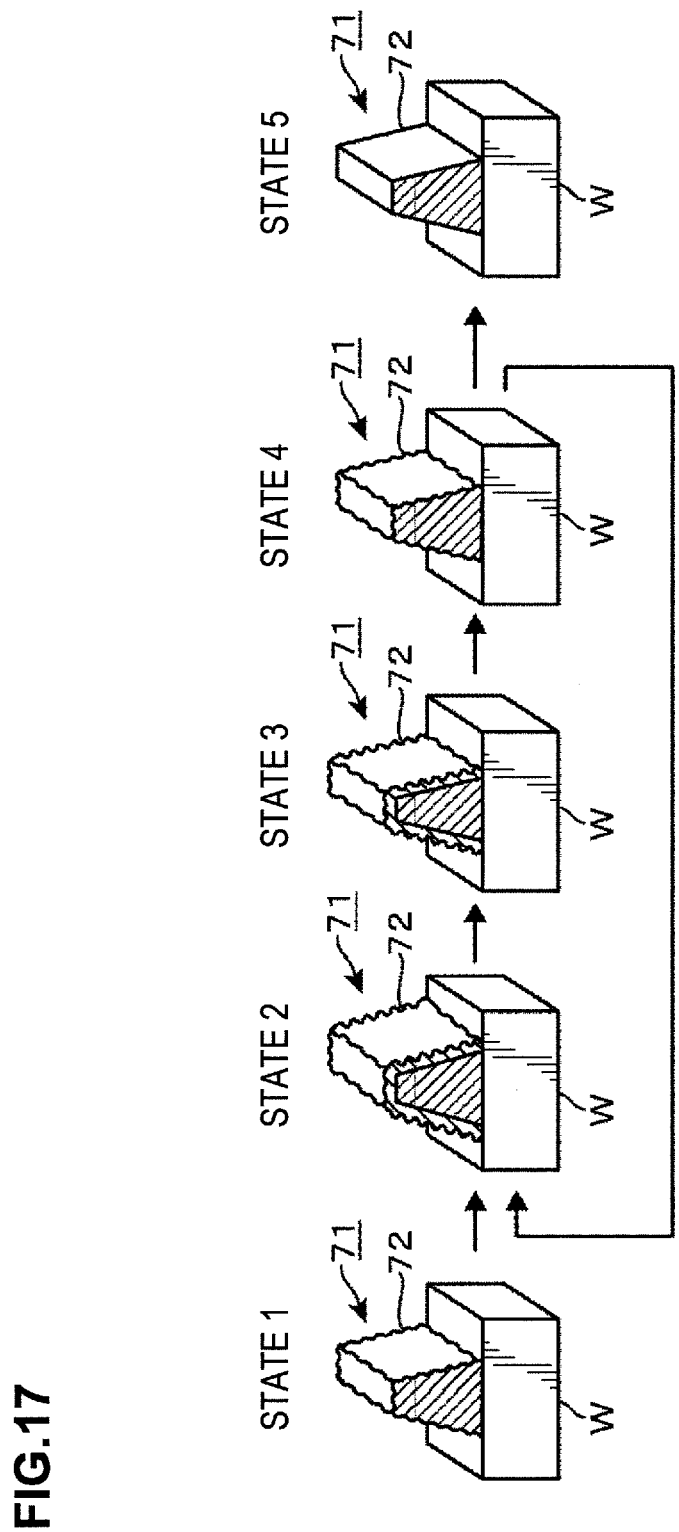
FIG. 17 is a schematic view illustrating states of the resist pattern.
Figure 18:
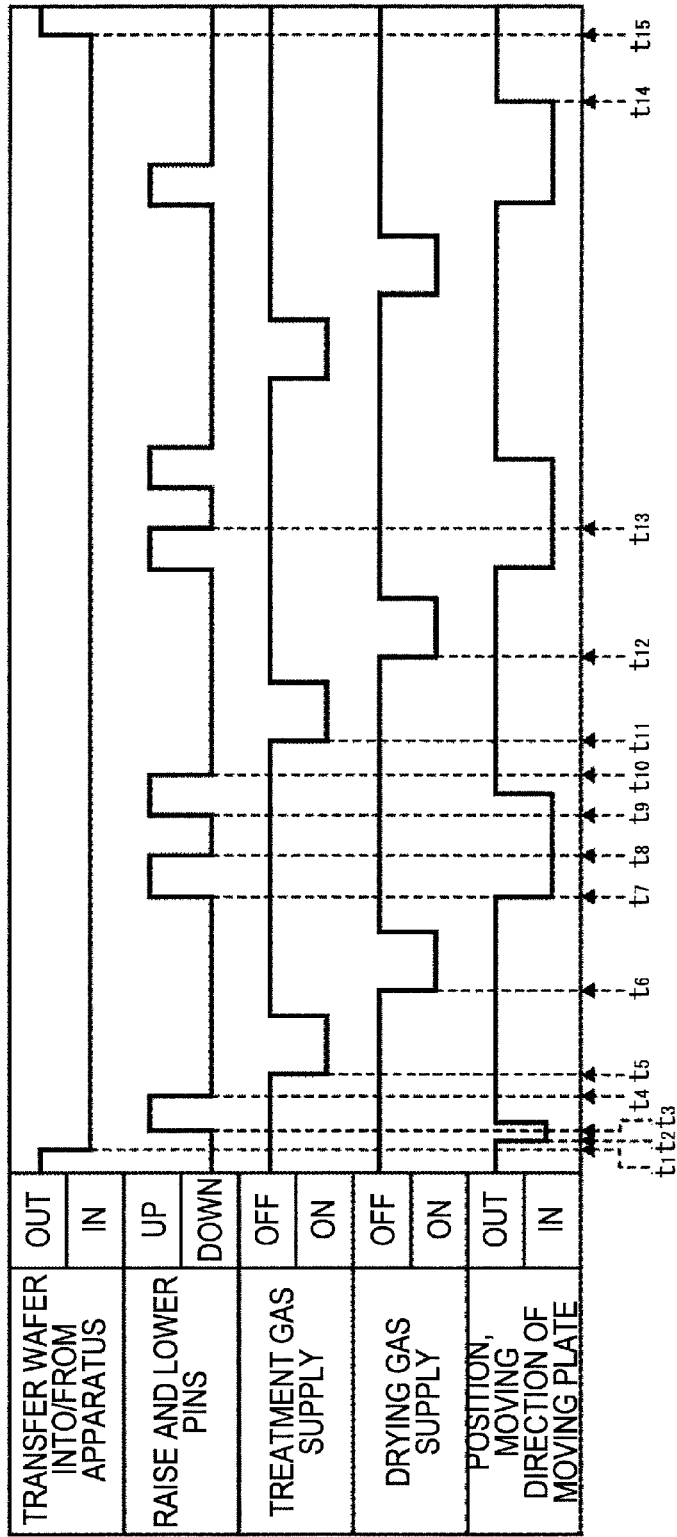
FIG. 18 is a time chart indicating the gas supply and action by the solvent supply apparatus.

The surface 72 of the resist pattern 71 is exposed to the treatment gas and swells as illustrated at state 2 in FIG. 17. As has been described with FIG. 7 to FIG. 9, the supply amount of the treatment gas is larger at the center portion of the wafer W than at the peripheral portion of the wafer W, and the volatile amount of the solvent is larger at the center portion of the surface than at the peripheral portion. Conversely, the supply amount of the treatment gas is smaller at the peripheral portion of the wafer W than at the center portion of the wafer W, and the amount of the solvent not vaporizing but adhering is larger at the peripheral portion than at the center portion. Accordingly, the amount of the solvent adhering to and permeating the surface 72 of the resist pattern 71 is made uniform between the center portion and the peripheral portion of the wafer W, so that the surface 72 swells and dissolves with high uniformity between the center portion and the peripheral portion.

Figure 13:
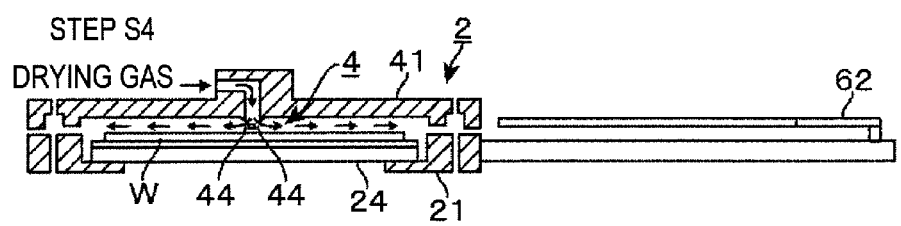
FIG. 13 is a process chart illustrating treatment by the solvent supply apparatus.

After a lapse of, for example, 5 to 10 seconds after the supply of the treatment gas is started, the supply of the treatment gas from the gas discharge ports 44 is stopped, and the drying gas is discharged from the gas discharge ports 44 of the gas supply part 4 to the center portion of the wafer W, flows to the peripheral portion, and is exhausted together with the purge gas as illustrated in FIG. 13 (time t6 in FIG. 18) (Step S4). By exposure to the drying gas, the solvent permeated the surface 72 of the resist pattern 71 vaporizes and dries as illustrated as state 3 in FIG. 17. Because of the supply of the drying gas from the gas discharge ports 44, the supply amount of the drying gas to the center portion of the wafer W becomes larger than that to the peripheral portion, so that the drying speed is higher at the center portion of the wafer W than at the peripheral portion so that the swelling amount of the surface 72 of the resist pattern 71 is more surely made uniform within the wafer W.

Figure 14:
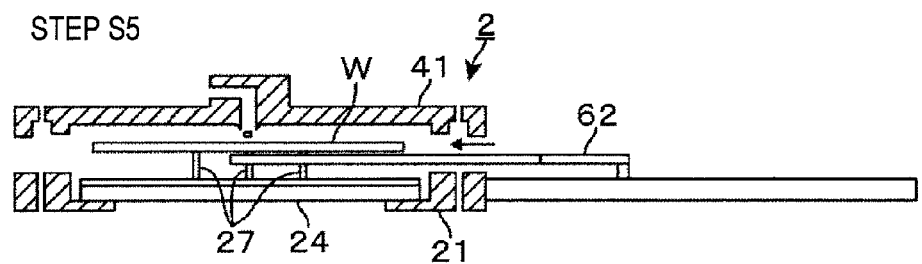
FIG. 14 is a process chart illustrating treatment by the solvent supply apparatus.
Figure 15:
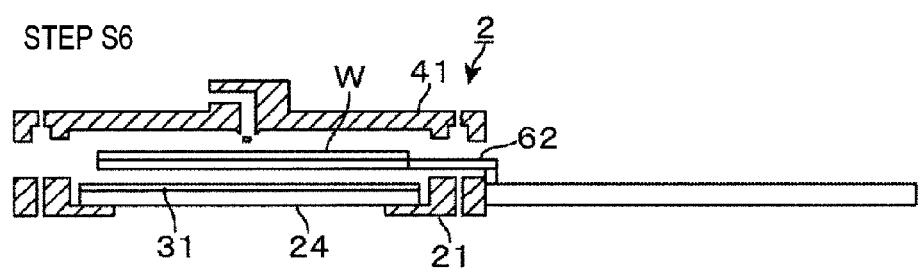
FIG. 15 is a process chart illustrating treatment by the solvent supply apparatus.

After a lapse of, for example, 5 to 10 seconds after the supply of the drying gas is started, the supply of the drying gas from the gas discharge ports 44 and the supply of the purge gas from the purge gas discharge ports 29 are stopped, the lid body 41 is raised, the pins 27 raise the wafer W, and the moving plate 62 moves to a position above the stage 24 as illustrated in FIG. 14 (time t7 in FIG. 18) (Step S5). When the moving plate 62 is controlled to a temperature higher than that of the stage 24 by the heaters 66 and the pins 27 are lowered to mount the wafer W on the moving plate 62 as illustrated in FIG. 15 (time t8 in FIG. 18), the whole wafer W is heated to, for example, 60° C. Thus, the surface 72 of the resist pattern 71 at the center portion and the peripheral portion of the wafer W is further dried and the temperature of the wafer W is further increased, whereby the flowability of the polymer constituting the resist pattern increases to proceed the improvement of the projections and depressions as illustrated at state 4 in FIG. 17. When the solvent vaporizes and the drying of the surface 72 proceeds, the flowability of the polymer decreases to suppress the permeation of the solvent into the resist pattern 71 (Step S6).

Figure 16:
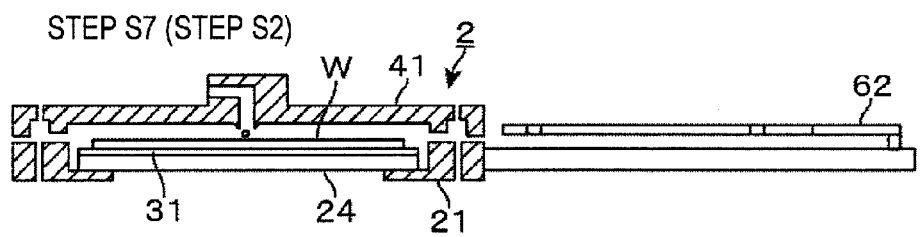
FIG. 16 is a process chart illustrating treatment by the solvent supply apparatus.

After a lapse of, for example, 10 to 60 seconds after the wafer W is mounted on the moving plate 62, the pins 27 are raised to lift up the wafer W from the moving plate 62 (time t9 in FIG. 18), and the moving plate 62 moves to the waiting position. The pins 27 are lowered to mount the wafer W on the stage 24 (time t10 in FIG. 18), and the lid body 41 of the treatment container 2 is lowered, and the wafer W is adjusted in temperature by the stage 24 as illustrated in FIG. 16 (Step S7). In other words, the above-described Step S2 is performed again.

Thereafter, the supply of the treatment gas at Step S3 (time t11 in FIG. 18), the supply of the drying gas at Step S4 (time t12 in FIG. 18), the delivery of the wafer W to the moving plate 62 at Step S5 (time t13 in FIG. 18), the heating of the wafer W at Step S6 are performed, and after completion of Step S6, the treatments at Steps S2 to S6 are further repeatedly performed as illustrated in the time chart in FIG. 18. Thereby, the resist pattern 71 at the center portion and the peripheral portion of the wafer W is repeatedly brought into the states of state 2 to state 4 in FIG. 17 and the projections and depressions on the resist pattern are gradually evened out, whereby the surface 72 is smoothed as in state 5. After, for example, Steps S2 to S6 in a third time are performed, the moving plate 62 returns to the waiting position with the wafer W mounted thereon (time t14 in FIG. 18), and the transfer arm 13 receives the wafer W and transfers the wafer W to the outside of the solvent supply apparatus 1 (time t15 in FIG. 18). Thereafter, in order to completely remove the solvent, the wafer W is transferred, for example, to a heating apparatus and heated at a temperature higher than the heating temperature by the moving plate 62.

According to this solvent supply apparatus 1, the wafer W is heated such that the temperature at the center portion is higher than that at the peripheral portion when the treatment gas is supplied from the gas discharge ports 44 above the center portion of the wafer W, to form a temperature gradient in the wafer W. This makes the volatile amount of the solvent larger at the center portion of the wafer W than at the peripheral portion, so that the swelling amount of the pattern can be made uniform within the wafer W. Therefore, it is possible to prevent the resist pattern from being dissolved and improve the roughness of the surface of the resist pattern with high uniformity within the wafer W.

Further, in the solvent supply apparatus 1, the supply of the treatment gas and the drying gas is repeated to one wafer W. This makes it possible to suppress the permeation of the solvent to the inside of the resist pattern to more surely prevent the resist pattern from being dissolved within the wafer W and improve the roughness of the surface of the resist pattern.

Further, in the solvent supply apparatus 1, heating performed on the wafer W by the moving plate 62 after the supply of the drying gas increases the drying speed of the solvent, resulting in improved throughput. The temperature of the stage 24 may be set to be high instead of heating by the moving plate 62, but it is more effective that the moving plate 62 temperature-adjusted to be higher than the stage 24 moves the wafer W for drying in order to prevent the volatile amount of the solvent from the wafer W from becoming too much during the supply of the treatment gas. However, the resist pattern may be dried by continuing the supply of the drying gas without moving the wafer W by the moving plate 62.

Modification Examples of First Embodiment

Figure 19:
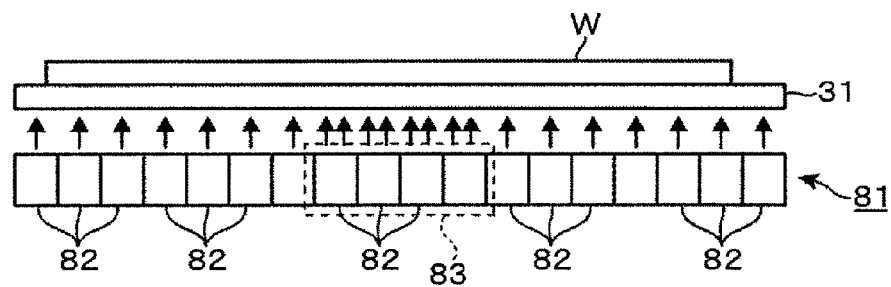
FIG. 19 is a longitudinal side view illustrating another configuration of the hot plate.

Hereinafter, modification examples of the first embodiment will be described. FIG. 19 illustrates a first modification example in which the heat source for heating the hot plate 31 is composed of an LED group 81. The LED group 81 is composed of many LEDs 82 provided below the whole hot plate 31, and each of the LEDs 82 irradiates the hot plate 31 with infrared light to thereby heat the hot plate 31. The LEDs 82 heating the center portion of the hot plate 31 surrounded by a dotted line 83 in the drawing in the LED group 81 are set higher in output than the other LEDs 82, whereby the center portion of the wafer W is heated to a temperature higher than that at the peripheral portion.

Figure 20:
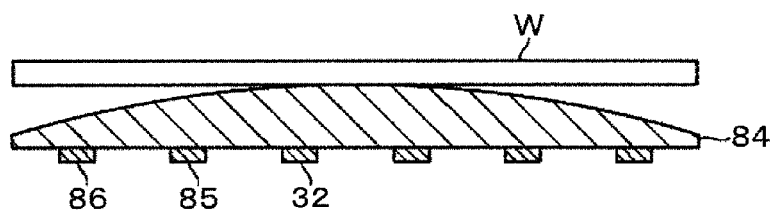
FIG. 20 is a longitudinal side view illustrating another configuration of the hot plate.

FIG. 20 illustrates a second modification example. The front surface of a hot plate 84 in FIG. 20 is curved such that the front surface at the center portion is higher in height than the front surface at the peripheral portion. Thus, the distance between the peripheral portion of the wafer W and the hot plate 84 is larger than the distance between the center portion of the wafer W and the hot plate 84. Further, ring-shaped heaters 85, 86 different in diameter from each other are concentrically arranged relative to the heater 32 in a manner to surround the heater 32 on the rear surface of the hot plate 84. The heaters 32, 85, 86 control the temperature of the front surface of the hot plate 84 to be uniform, but the temperature at the center portion of the wafer W becomes higher than the temperature at the peripheral portion due to the difference in heat-transfer rate to the wafer W caused by the difference in magnitude between the above-described distances. This makes it possible to make the drying amount of the solvent at the center portion of the wafer W larger than that at the peripheral portion.

Figure 21:
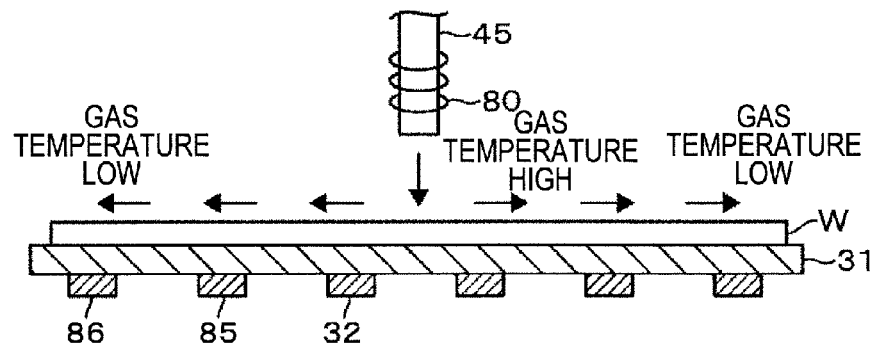
FIG. 21 is a longitudinal side view illustrating another configuration of the hot plate.

FIG. 21 illustrates a third modification example. The hot plate 31 in FIG. 21 is provided with the already-described heaters 32, 85, 86. By the heaters 31, 85, 86, the front surface of the hot plate 31 is heated to a uniform temperature. Further, a heater 80 is provided along a gas supply pipe 45 connected to the already-described treatment container 2 and heats the treatment gas flowing through the gas supply pipe 45. When treating the wafer W, the temperature of the treatment gas supplied into the treatment container 2 is controlled by the heater 80 to become higher than the temperature of the wafer W adjusted in temperature by the hot plate 31.

Then, the treatment gas supplied to the center portion of the wafer W is cooled during the time when it flows over the front surface of the wafer W, and the solvent in the treatment gas therefore becomes more likely to condense and adhere to the wafer W as it flows closer to the peripheral portion of the wafer W. Accordingly, the swelling amount can be made uniform within the wafer W. The third modification example can be combined with the method of forming the temperature distribution in the wafer W by the hot plate 31 illustrated in the first embodiment and the other modification examples of the first embodiment. Incidentally, in the first embodiment and later-described embodiments and their modification examples, the heater 80, for example, may be provided to adjust the temperature of the treatment gas to an appropriate temperature for appropriate treatment.

Figure 22:
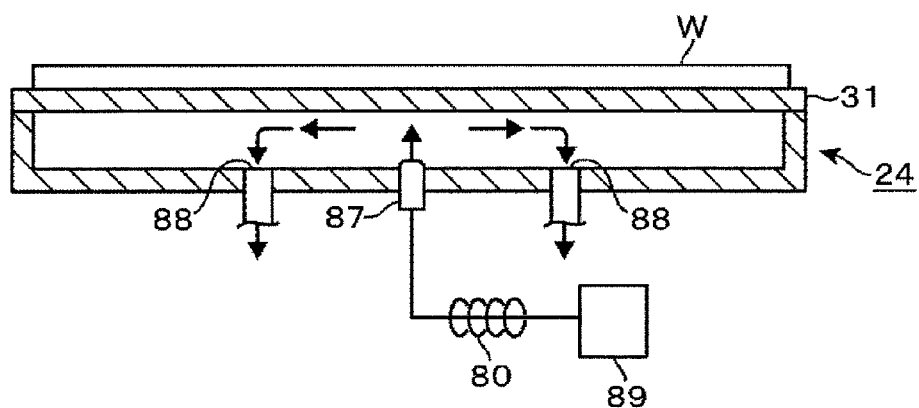
FIG. 22 is a longitudinal side view illustrating another configuration of a stage.

Further, FIG. 22 is a fourth modification example, in which the stage 24 is provided with a nozzle 87 discharging N2 gas to the center portion of the lower surface of the hot plate 31 and a plurality of exhaust ports 88 surrounding the nozzle 87 near the nozzle 87. Along a flow path connecting a supply source 89 for the N2 gas and the nozzle 87, the heater 80 is provided. The N2 gas heated by the heater 80 and supplied from the nozzle 87 is exhausted from the exhaust ports 88 as indicated by arrows in the drawing. Thus, the center portion of the wafer W is heated to a temperature higher than that at the peripheral portion. Further, to heat the center portion of the hot plate 31, a flow path for liquid may be formed at the center portion of the lower surface of the hot plate 31 and temperature-adjusted liquid may be passed through the flow path.

Figure 23:
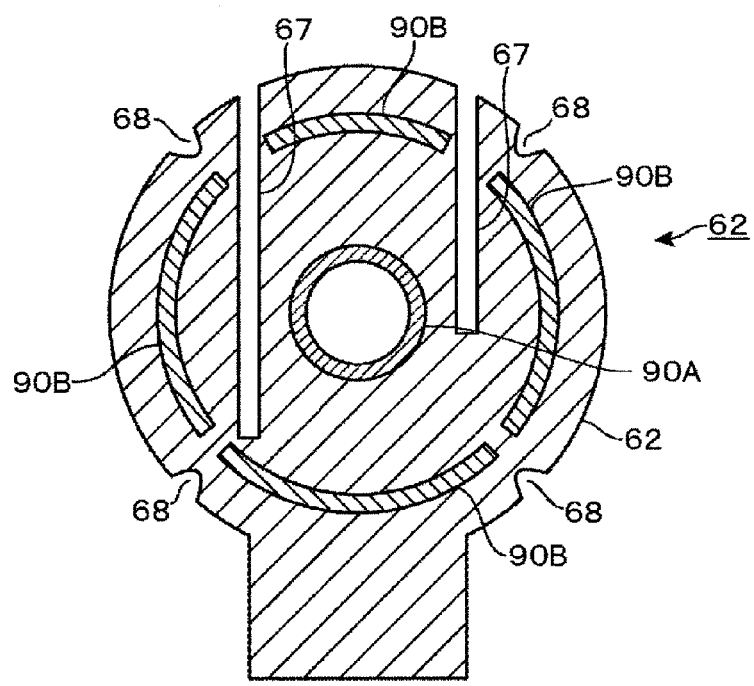
FIG. 23 is a transverse plan view of a moving plate.

As a fifth modification example, an example in which a temperature gradient is formed not only at supply of the treatment gas but also at heating by the moving plate 62 will be described. FIG. 23 is a transverse plan view of the moving plate 62. As illustrated in the drawing, a ring-shaped heater 90A is provided at the center portion of the moving plate 62, and a plurality of heaters 90B are provided at the peripheral portion. Each of the heaters 90B is formed in a manner that a ring is divided in the circumferential direction, and surround the heater 90A. The output of the heater 90A is set to be higher than the output of the heaters 90B so that the center portion of the wafer W is heated to a temperature higher than that at the peripheral portion. The moving plate 62 is configured as described above, whereby the vaporization of the solvent is accelerated further at the center portion of the wafer W than at the peripheral portion when the wafer W is mounted on the moving plate 62, so that the swelling amount of the resist pattern can be more surely made uniform.

Second Embodiment

Figure 24:
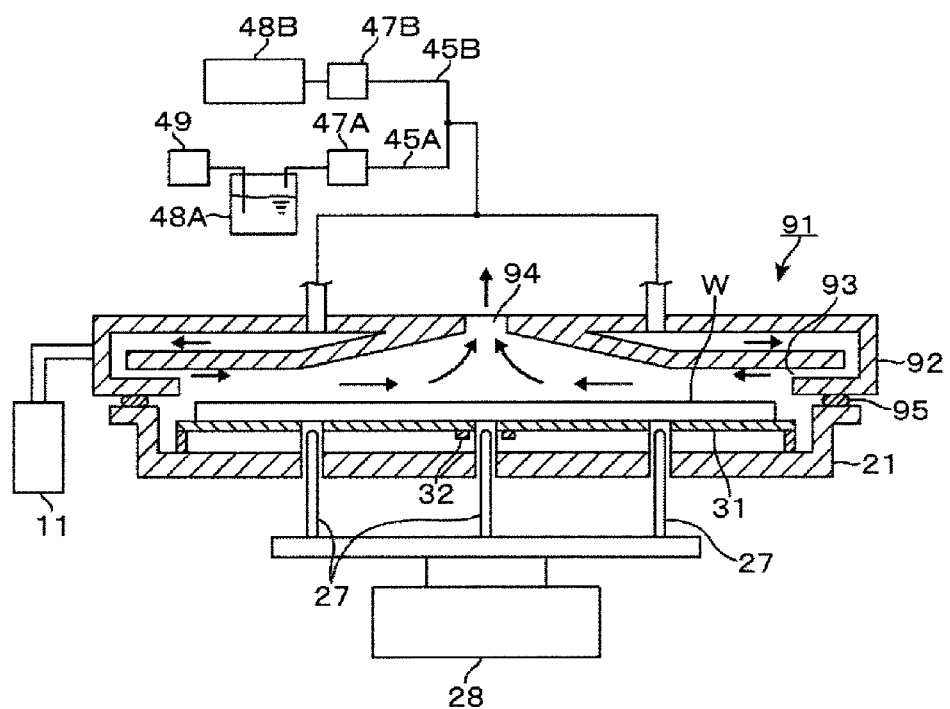
FIG. 24 is a longitudinal side view illustrating another configuration of a treatment container constituting the solvent supply apparatus.

Hereinafter, another embodiment will be described mainly for the different points from the first embodiment. In the solvent supply apparatus 1, the treatment container may be configured as illustrated in FIG. 24. FIG. 24 is a longitudinal side view of a treatment container 91 in which the treatment gas is supplied in a direction different from that in the treatment container 2. A lid body 92 constituting the treatment container 91 is provided with a ring-shaped gas discharge port 93 outside the wafer W in a manner to surround the wafer W. Further, an exhaust port 94 is opened above the center portion of the wafer W so that the treatment gas and the drying gas discharged from the gas discharge port 93 flow to the center portion of the wafer W and are exhausted from the exhaust port 94 as indicated with arrows in the drawing. A numeral 95 in the drawing denotes a sealing material.

Figure 25:
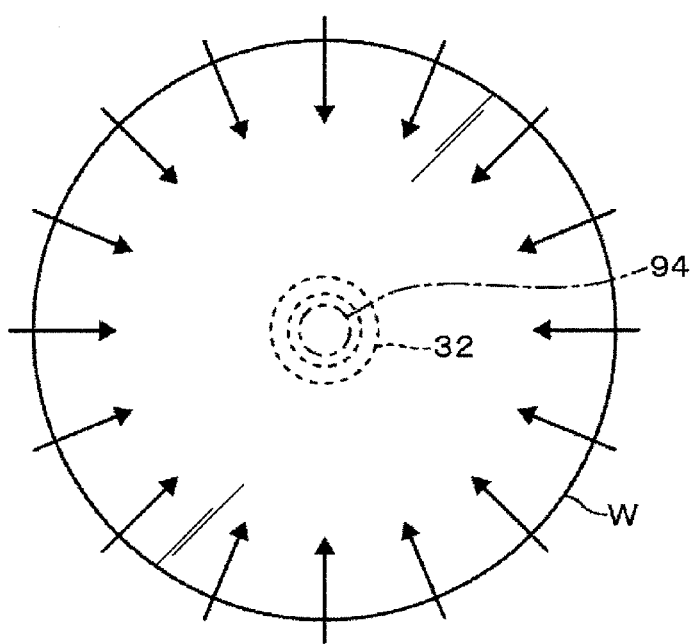
FIG. 25 is a plan view of a wafer mounted on the stage in the treatment container.

The treatment gas discharged from the gas discharge port 93 gathers to the center portion of the wafer W by exhaust. Therefore, the flow speed of the treatment gas becomes higher at the center portion of the wafer W than at the peripheral portion, whereby the concentration of the treatment gas becomes higher and the proportion of the molecules 70 of the treatment gas colliding with the resist pattern increases and the swelling amount becomes likely to increase. Hence, the heater 32 is arranged below the center portion of the wafer W as illustrated in FIG. 24, FIG. 25 as in the first embodiment such that the temperature is higher at the center portion of the wafer W than at the peripheral portion.

With the configuration, the volatilization of the solvent is accelerated further at the center portion of the wafer W than at the peripheral portion, and the swelling amount of the resist pattern can be made uniform within the wafer W as in the first embodiment. Further, for example, the supply of the treatment gas and the drying treatment by the drying gas and the moving plate are alternately and repeatedly performed also in the second embodiment as in the first embodiment. Since the drying gas is supplied in the same direction as the treatment gas, the flow speed and the concentration of the drying gas are higher at the center portion of the wafer W closer to the exhaust ports 94. In other words, since the drying speed by the drying gas is higher at the center portion of the wafer W than at the peripheral portion, the swelling amount of the resist pattern can be more surely made uniform within the wafer W. Furthermore, the gases are supplied alternately and repeatedly, thereby making it possible to suppress the permeation of the solvent to the inside of the resist pattern as in the first embodiment and more surely improve the roughness of the resist pattern. By applying the modification examples descried in the first embodiment also to the second embodiment, the center portion of the wafer W can be heated to a temperature higher than that at the peripheral portion by the hot plate 31, 84.

Third Embodiment

Figure 26:
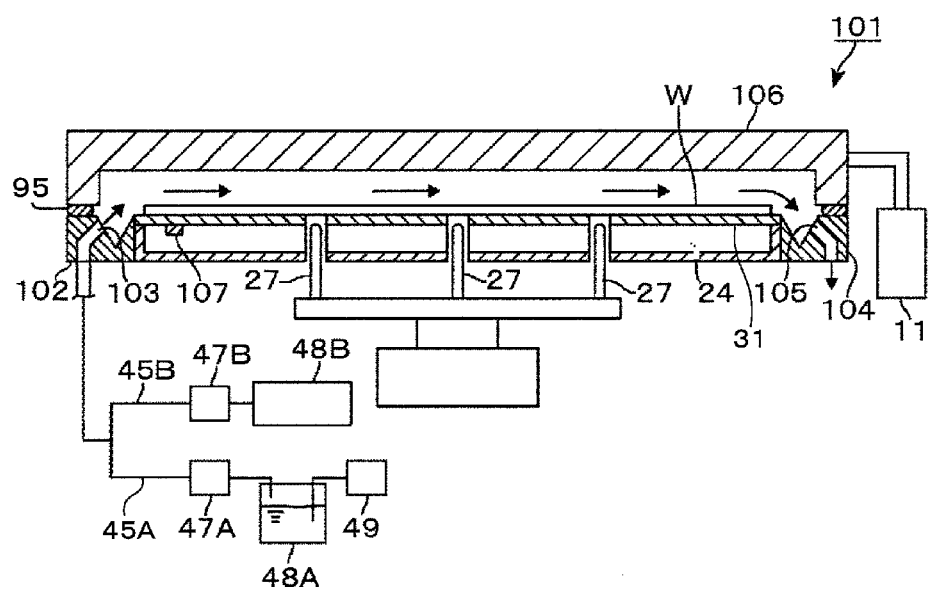
FIG. 26 is a longitudinal side view illustrating still another configuration of the treatment container constituting the solvent supply apparatus.
Figure 27:
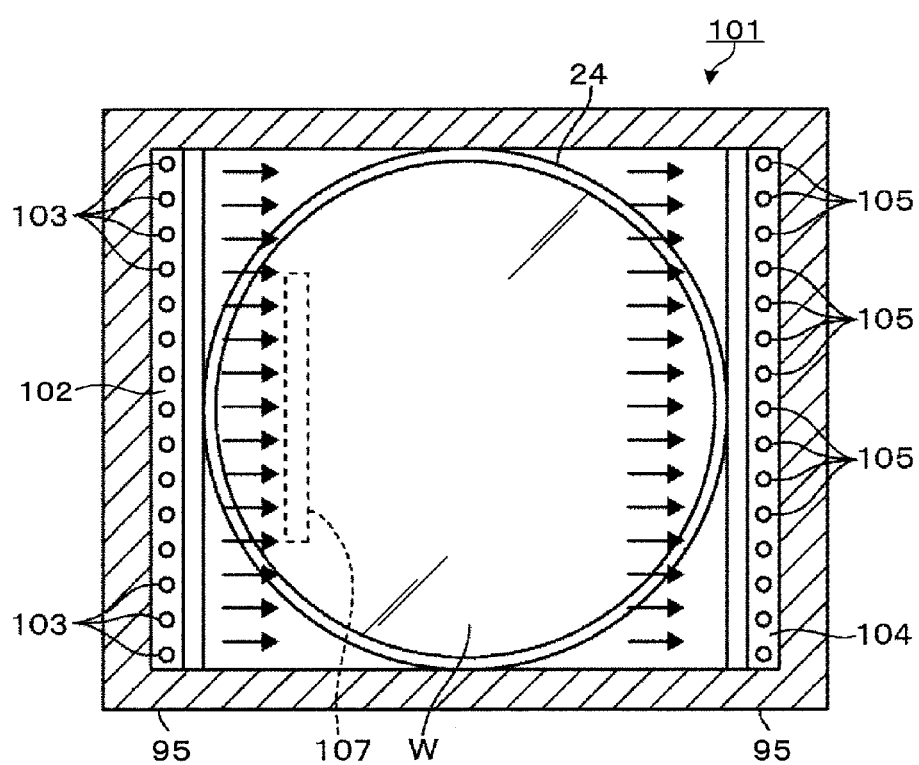
FIG. 27 is a transverse plan view of the treatment container.

FIG. 26, FIG. 27 illustrate a longitudinal side view and a transverse plan view of a treatment container 101, respectively. A numeral 102 in the drawings denotes a gas supply part provided on one end side of the stage 24, and gas discharge ports 103 are formed in its upper surface. A numeral 104 in the drawings denotes an exhaust part provided on the other end side of the stage 24 and includes exhaust ports 105. The treatment gas and the drying gas discharged from the gas discharge ports 103 flow from one end side to the other end side of the wafer W between the stage 24 and a ceiling plate of a lid body 106 of the treatment container 101 and is exhausted.

In the treatment container 101 in which the treatment gas flows in one direction as described above, the distribution of the flow speed on the front surface of the wafer W is reduced as compared to the treatment container in which the treatment gas flows from the peripheral portion side to the center portion side or from the center portion side to the peripheral portion side, and therefore the gradient in solvent concentration of the resist pattern is less likely to be formed within the wafer W. However, in the treatment container 101, the treatment gas discharged from the gas discharge ports 103 flows to the exhaust ports 105 while the solvent molecules 70 contained therein are being absorbed into the wafer W. Therefore, the solvent concentration gradually decreases as it is closer to the downstream side of the treatment gas on the front surface of the wafer W. In other words, the proportion (probability) of the solvent molecules 70 colliding on one end portion of the wafer W closer to the gas discharge ports 103 becomes higher than the proportion (probability) of the solvent molecules 70 colliding on the other end portion of the wafer W closer to the gas exhaust ports 105. Hence, a heater 107 is provided on the one end side of the lower surface of the hot plate 31 in this embodiment.

The heater 107 extends in a direction intersecting the flow direction of the treatment gas. By the heater 107, the temperature at one end portion of the wafer W becomes higher than the temperature at the other end portion at the supply of the treatment gas, and the vaporization of the solvent is accelerated further at the one end portion than at the peripheral portion so that the swelling amount of the resist pattern can be made uniform within the wafer W as in the first embodiment. Further, also in the third embodiment, the supply of the treatment gas and the drying treatment by the supply of the drying gas and the heating by the moving palate are alternately and repeatedly performed, for example, as in the first embodiment. The drying gas is supplied in the same direction as that of the treatment gas and flows toward the exhaust ports 105 while taking the solvent atmosphere thereinto, whereby the concentration becomes higher at the one end portion than at the other end portion. Therefore, the drying power becomes higher at the one end portion of the wafer W than at the other end portion. The swelling amount of the resist pattern can be more surely made uniform within the wafer W. Further, the supply of the treatment gas and the drying treatment are alternately and repeatedly performed, thereby making it possible to suppress the permeation of the solvent to the inside of the resist pattern as in the first embodiment and more surely improve the roughness of the resist pattern.

By applying the modification examples descried in the first embodiment also to the third embodiment as in the second embodiment, the temperature of the wafer W at the one end portion can be made higher than the temperature at the other end portion instead of making the temperature at the center portion of the wafer W higher than that at the peripheral portion, and the treatment gas adjusted to a temperature higher than the temperature of the wafer W can be supplied from the gas discharge ports 103 and exhausted from the exhaust ports 105. As described above, the method of controlling the temperature of the treatment gas can be combined with the method of forming the temperature distribution in the hot plate as in the first embodiment. Further, concretely describing the case of applying the fifth modification example, the temperature of the heater 90B located below the one end side of the wafer W among the heaters 90B illustrated in FIG. 23 is increased to be higher than the temperatures of the other heaters 90B.

Though the discharge ports for the treatment gas and the discharge ports for the drying gas are shared in each of the above-described embodiments, these discharge ports may be separately formed because the already-described effects can be achieved as long as the flowing direction of the treatment gas and the flowing direction of the drying gas are the same.

Further, each treatment container may be evacuated into a vacuum atmosphere, and each of the gases may be supplied into the vacuum atmosphere. Further, when the treatment gas and the drying gas are supplied from the center portion of the wafer W to the peripheral portion, the exhaust ports are not limited to those provided around the entire circumference of the wafer W as in the first and second embodiments, but the exhaust ports may be provided on one end side and the other end side of the wafer W so that the gases are exhausted from the one end side and the other end side.

[Reference Test]

Next, reference tests carried out relating to the present invention will be described. At a plurality of places along the diameter direction of the wafer W (assumed to be a wafer A1) on which a resist pattern was formed, the variation (LWR) in measured dimension of the resist pattern was measured. The LWR is indicated by three times a standard deviation of the variation (three sigma). Further, wafers A2, A3 on each of which a resist pattern was formed similarly to the wafer A1 were prepared. The wafer A2 was mounted on the hot plate 31 with uniform temperature and subjected to supply treatment of the gases according to the first embodiment and measured similarly to the wafer A1, and the three sigma of the roughness of the resist pattern at each portion was calculated. Further, as for the wafer A3, the wafer W was continuously supplied with the treatment gas for a predetermined time without repeat supply of the treatment gas and the drying gas and then subjected to heat treatment, and the three sigma at each portion was calculated as with the wafers A1, A2.

Figure 28:
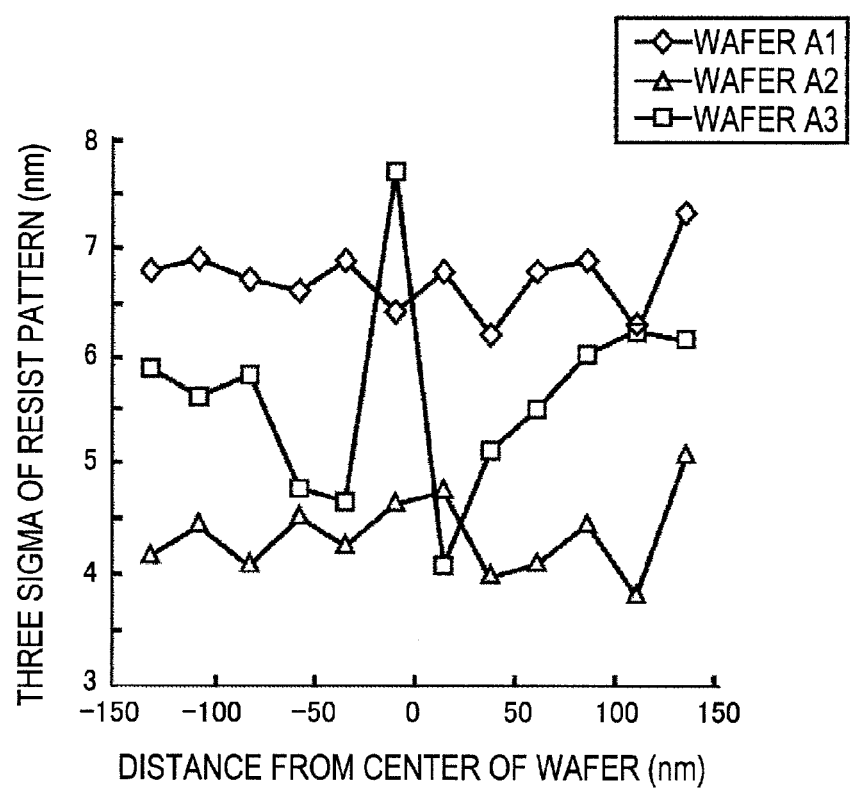
FIG. 28 is a graph chart presenting results of evaluation tests.

Graphs in FIG. 28 represent the results of the evaluation tests. The horizontal axis indicates the measurement position of the wafer W. On the horizontal axis, −150, +150 represent one end and the other end of the wafer W respectively, and 0 represents the center of the wafer W. The vertical axis indicates the calculated three sigma and its unit is nm. As represented by the graphs, the wafer A2 has a low three sigma at each measurement place as compared to the wafer A1. In other words, the variation in roughness of the resist pattern is small within the wafer W. Further, the value of the three sigma at the center portion of the wafer W in the wafer A3 was higher than the value in the wafer A1. This is because dissolution of the resist pattern occurred at the center portion of the wafer A3. The results of the evaluation tests show that it is possible to improve the roughness of the resist pattern with high uniformity within the wafer W by repeatedly performing the supply of the treatment gas and the supply of the drying gas.

What is claimed is:

1. A substrate treatment method of performing treatment on a substrate on which a resist pattern mask has been formed by exposure and developing treatment to improve roughness of the resist pattern mask, said method comprising the processes of:
    mounting and heating the substrate on a stage in a treatment container, the stage includes a temperature adjustment mechanism, the treatment container includes a lid body;
    subsequently supplying a solvent gas from a gas discharge port provided in the lid body at a position corresponding to a center portion of the substrate to a front surface of the substrate while exhausting the solvent gas from an exhaust port provided at a periphery of the substrate to swell the resist pattern mask; and
    while performing said process of supplying and exhausting the solvent gas, forming a temperature gradient in the substrate via the stage such that a temperature at the center portion of the substrate is higher than a temperature at the peripheral portion of the substrate;
    wherein said process of forming the temperature gradient in the substrate is performed by at least one of (i) adjusting a temperature of the stage by controlling the temperature adjustment mechanism, and (ii) the stage having a front surface in which a center portion of the front surface of the stage is higher in height than a peripheral portion of the front surface of the stage.

2. The substrate treatment method as set forth in claim 1, further comprising the process of:
    instead of said process of supplying the solvent gas from the gas discharge port to the front surface of the substrate while exhausting the solvent gas from the exhaust port, repeating a plurality of times steps of supplying the solvent gas from the gas discharge port while exhausting the solvent gas from the exhaust port, and then supplying a drying gas for drying the solvent gas from the gas discharge port to the substrate while exhausting the drying gas from the exhaust port.

3. The substrate treatment method as set forth in claim 1, further comprising the process of:
    instead of said process of supplying the solvent gas from the gas discharge port to the front surface of the substrate while exhausting the solvent gas from the exhaust port, repeating a plurality of times steps of supplying the solvent gas from another gas discharge port provided in the periphery of the substrate while exhausting the solvent gas from another exhaust port provided in the lid body at a position corresponding to the center portion of the substrate, and then supplying a drying gas for drying the solvent gas from said another gas discharge port to the substrate while exhausting the drying gas from said another exhaust port.

4. A substrate treatment method of performing treatment on a substrate on which a resist pattern mask has been formed by exposure and developing treatment to improve roughness of the resist pattern mask, said method comprising the processes of:
    mounting and heating the substrate on a stage in a treatment container, the stage includes a temperature adjustment mechanism, the treatment container includes a lid body;
    subsequently supplying a solvent gas from a gas discharge port provided at a periphery of the substrate to a front surface of the substrate while exhausting the solvent gas from an exhaust port provided in the lid body at a position corresponding to a center portion of the substrate to swell the resist pattern mask; and
    while performing said process of supplying and exhausting the solvent gas, forming a temperature gradient in the substrate via the stage such that a temperature at the center portion of the substrate is higher than a temperature at the peripheral portion of the substrate;
    wherein said process of forming the temperature gradient the substrate is performed by at least one of (i) adjusting a temperature of the stage by controlling the temperature adjustment mechanism, and (ii) the stage having a front surface in which a center portion of the front surface of the stage is higher in height than a peripheral portion of the front surface of the stage.

5. The substrate treatment method as set forth in claim 4, further comprising the process of:
    instead of said process of supplying the solvent gas from the gas discharge port to the front surface of the substrate while exhausting the solvent gas from the exhaust port, repeating a plurality of times steps of supplying the solvent gas from another gas discharge port provided in the lid body at a position corresponding to the center portion of the substrate while exhausting the solvent gas from another exhaust port provided in the periphery of the substrate, and then supplying a drying gas for drying the solvent gas from said another gas discharge port to the substrate while exhausting the drying gas from said another exhaust port.

6. The substrate treatment method as set forth in claim 4, further comprising the process of:

instead of said process of supplying the solvent gas from the gas discharge port to the front surface of the substrate while exhausting the solvent gas from the exhaust port, repeating a plurality of times steps of supplying the solvent gas from the gas discharge port while exhausting the solvent gas from the exhaust port, and then supplying a drying gas for drying the solvent gas from the gas discharge port to the substrate while exhausting the drying gas from the exhaust port.

7. A substrate treatment method of performing treatment on a substrate on which a resist pattern mask has been formed by exposure and developing treatment to improve roughness of the resist pattern mask, said method comprising the processes of:

mounting the substrate on a stage in a treatment container; and supplying a solvent gas heated to a temperature higher than a temperature of the substrate from a gas supply provided above, a center portion of a front surface of the substrate while exhausting the solvent gas from an exhaust port provided at a periphery of the substrate to swell the resist pattern mask wherein the stage has a front surface in which a center portion of the front surface of the stage is higher in height than a peripheral portion of the front surface of the stage.

8. The substrate treatment method as set forth in claim 7, further comprising the process of:

instead of said process of supplying the solvent gas from gas supply pipe to the front surface of the substrate while exhausting the solvent gas from the exhaust port, repeating a plurality of times steps of supplying the solvent gas from the gas discharge pipe while exhausting the solvent gas from the exhaust port, and then supplying a drying gas for drying the solvent gas from the gas supply pipe to the substrate while exhausting the drying gas from the exhaust port.

* * * * *